United States Patent
Narwankar et al.

(10) Patent No.: US 7,658,973 B2
(45) Date of Patent: Feb. 9, 2010

(54) TAILORING NITROGEN PROFILE IN SILICON OXYNITRIDE USING RAPID THERMAL ANNEALING WITH AMMONIA UNDER ULTRA-LOW PRESSURE

(75) Inventors: Pravin K. Narwankar, Sunnyvale, CA (US); Gary E. Miner, Fremont, CA (US); Arnaud Lepert, Belmont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 899 days.

(21) Appl. No.: 10/772,893

(22) Filed: Feb. 4, 2004

(65) Prior Publication Data

US 2004/0248392 A1 Dec. 9, 2004

Related U.S. Application Data

(60) Provisional application No. 60/445,281, filed on Feb. 4, 2003.

(51) Int. Cl.
*B05D 3/02* (2006.01)
*C23C 16/00* (2006.01)
*B05D 1/40* (2006.01)
*B05D 3/12* (2006.01)
*H01L 21/31* (2006.01)
*H01L 21/469* (2006.01)

(52) U.S. Cl. ............... 427/376.2; 427/248.1; 427/331; 427/350; 427/372.2; 438/769; 438/775

(58) Field of Classification Search .............. None
See application file for complete search history.

(56) References Cited

U.S. PATENT DOCUMENTS 5,939,763 A * 8/1999 Hao et al. .................. 257/411
6,323,143 B1 11/2001 Yu
6,372,578 B1 * 4/2002 Muramatsu ................ 438/264
6,372,581 B1 * 4/2002 Bensahel et al. ............ 438/287
6,383,875 B1 5/2002 Thakur
2002/0073925 A1 6/2002 Noble et al.
2002/0119674 A1 * 8/2002 Thakur ...................... 438/758

(Continued)

FOREIGN PATENT DOCUMENTS

DE 43 33 160 A1 3/1995

(Continued)

OTHER PUBLICATIONS

Bensahel,D, et al."Front-end, single wafer diffusion processing for advanced 300-mm fabrication lines." Microelectronics Engineering, Elsevier Publishers BV., Amersterdam, NL, vol. 56, No. 1-2, May 2001, pp. 4-59.

(Continued)

*Primary Examiner*—Timothy Meeks
*Assistant Examiner*—Kelly M Gambetta
(74) *Attorney, Agent, or Firm*—Blakely Sokoloff Taylor & Zafman (57) ABSTRACT

A method of forming a dielectric film that includes nitrogen. The method includes incorporating nitrogen into a dielectric film using a nitridation gas and a rapid thermal annealing process, wherein an ultra-low pressure of equal to or less than about 10 Torr is used for the rapid thermal annealing process.

23 Claims, 8 Drawing Sheets

U.S. PATENT DOCUMENTS

2002/0197884 A1* 12/2002 Niimi et al. .................. 438/775
2004/0002226 A1* 1/2004 Burnham et al. ............ 438/776

FOREIGN PATENT DOCUMENTS

WO          WO99/43023          * 10/1999

OTHER PUBLICATIONS

Lo. G, Q, et al. "Effects of post-nitridation anneals on radiation hardness in rapid thermal nitrided gate oxides."

PCT Search Report for PCT Application No. PC/US2004/003442. Mailed on Apr. 7, 2005., (9 pages).

Sagnes, I, et al. "*Controlled Thin Oxidation and Nitridation in a Single Wafer Cluster Tool*" Materials Research Society Symposium Proceedings, Materials Research Society, Pittsburg, PA, US. vol. 387, Apr. 17, 1995 pp. 253-258.

Su, H. P., et al. "*High-Performance Nitrided Oxides Fabricated by Very-Low-Pressure Nitridation Technique*" Japanese Journal of Applied Physics, vol. 34, No. 4A, Apr. 1, 1995 pp. 1816-1821.

PCT Search Report, PCT/US2004/003442, mailed Aug. 25, 2004, (6 pages).

Ito, T., et al., "Direct Thermal Nitridation of Silicon Dioxide Films In Anhydrous Ammonia Gas," J. Electrochem Soc.: Solid-State and Technology/Optical Properties, vol. 127, No. 9, Sep. 1980, pp. 2053-2057.

Ito, T., et al., "Retardation of Destructive Breakdown of $SiO_2$ Films Annealed in Ammonia Gas," J. Electrochem Soc.: Solid-State and Technology/Ammonia Gas, vol. 127, No. 10, Sep. 1980, pp. 2248-2251.

Lek, C. M., et al., "Impact of Decoupled Plasma Nitridation of Ultra-Thin Gate Oxide on the Performance of P-Channel MOSFETs," Institute of Physics Publishing, Semicond. Sci. Technol., vol. 17, 2002, pp. L25-L28.

First Office Action from Chinese Patent Application No. 200480005652.9 mailed Mar. 23, 2007, 18 pgs.

Second Office Action from Chinese Patent Application No. 200480005652.9 mailed Aug. 31, 2007, 22 pgs.

Third Office Action from Chinese Patent Application No. 200480005652.9 mailed Mar. 21, 2008, 4 pgs.

Final Decision of Rejection from Chinese Patent Application No. 200480005652.9 mailed Jun. 27, 2008, 36 pgs.

* cited by examiner

| Nitridation Process | [N] Profile | Explanation of the profile | Comments |
|---|---|---|---|
| NO or NO + O$_2$ Mixture Growth | Gate SiO$_2$ Sub.  | N Incorporated throughout the film | Poor device performance due to high [N] at the substrate interface |
| N$_2$O Anneal | Gate SiO$_2$ Sub.  | N close to Si/SiO$_2$ interface | [N] Content insufficient to block Boron or reduce leakage in 0.1 μm devices |
| NO Anneal | Gate SiO$_2$ Sub.  | N at the Si/SiO2 interface | [N] higher than N$_2$O anneal. Traps B inside SiO$_2$. Poor interfacial properties and not significant reduction in leakage current |
| NH$_3$ Anneal (High Pressure ≥ 100 Torr) | Gate SiO$_2$ Sub.  | Bimodal [N] distribution. N at the surface & substrate interface | [N] higher than NO anneal. N at surface traps Boron. Poor interfacial properties |
| Plasma Nitridation | Gate SiO$_2$ Sub.  | High [N] at the poly/oxide interface | [N] at the surface blocks the Boron. Drive current degrades for ultra-thin dielectrics (<10Å) |
| NH3 Anneal (Low Pressure ≤ 10 Torr) | Gate SiO$_2$ Sub.  | Ideal profile. High [N] at the poly/oxide interface | High Drive current than plasma nitridation. Allows EOT scaling < 11Å. |

TABLE 1

TAILORING NITROGEN PROFILE IN SILICON OXYNITRIDE USING RAPID THERMAL ANNEALING WITH AMMONIA UNDER ULTRA-LOW PRESSURE

RELATED APPLICATIONS

This application is related to and claims the benefit of U.S. Provisional Patent application Ser. No. 60/445,281 filed Feb. 4, 2003, which is hereby incorporated by reference in its entirety.

BACKGROUND

1. Field

The present invention relates generally to the field of semiconductor manufacturing. More specifically, the present invention relates to a method of forming a silicon oxynitride (SiON or $SiO_xN_y$) gate dielectric and integrating it into a gate stack using Rapid Thermal Process (RTP).

2. Description of the Related Art

Figure 1:
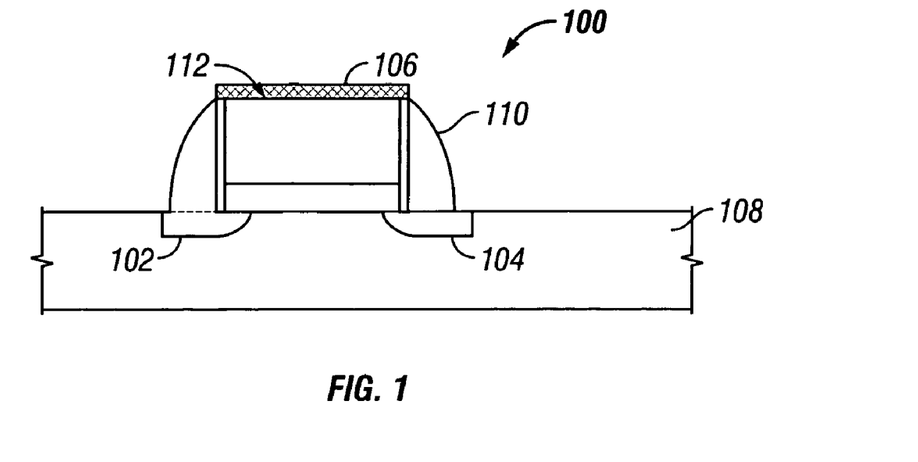
FIG. 1 illustrates an exemplary transistor.

Integrated circuits are made up of literally million of active and passive devices such as transistors, capacitors and resistors. A transistor 100 generally includes a source 102, a drain 104, and a gate stack 106. The gate stack (FIG. 1) consists of a substrate 108 (e.g., typically made of silicon) on top of which is grown a dielectric 110 (typically made of silicon dioxide ($SiO_2$)) and this is capped with an electrode 112 (made with a conductive material such as polycrystalline silicon).

In order to provide more computational power, the trend is to scale down transistors by shrinking device geometry. Moore's law scaling requires that the gate drive current must increase in order to increase the speed of the transistor. The gate drive current give by equation (1) can be increased by increasing the gate capacitance ($C_{ox}$), which in turn (as shown by equation (2)) can be increased by either decreasing the dielectric thickness (d) or using a dielectric that has higher dielectric constant (k) than the existing $SiO_2$ dielectric (k=3.9).

$$I_D \sim \mu / Lg * C_{ox}(V_{DD} - V_{TH})^2 \quad (1)$$

$$C_{ox} = \frac{kA}{d} \quad (2)$$

where $I_D$ is the Drive Current; u is the Carrier Mobility, Lg is the gate length, $C_{ox}$ is the Gate Capacitance, $V_{DD}$ is the Opening Voltage; $V_{TH}$ is the Threshold Voltage; k is the dielectric constant, d is the dielectric thickness, and A is the device area.

To avoid complex integration and materials handling issues, device manufacturers would like to scale the device parameters as much as they can by decreasing the dielectric thickness. However lowering the $SiO_2$ thickness below 20 Å results in poor gate reliability due to increase in tunneling current, increase in boron penetration into the substrate and poor process control for very thin oxide. While in theory the alternative of using a higher k gate dielectric appears very attractive, the material compatibility with the underlying Si substrate and the polysilicon gate electrode cannot be matched to what is provided with $SiO_2$. Additionally, using $SiO_2$ eliminates many materials handling contamination issues that must be dealt with when introducing rare-earth oxide as gate dielectrics.

Challenges encountered in extending $SiO_2$ to 0.1 µm technology node and beyond, include (1) boron penetration in a transistor such as a PMOS device with a P+ boron (B) doped gate electrode into the gate oxide and underlying Si substrate. And, (2) increasing gate leakage current with decreasing gate oxide thickness.

Nitridation of the $SiO_2$ layer to form silicon oxynitride ($SiO_xN_y$, or alternatively SiON) has evolved as a promising candidate to scale the $SiO_2$ dielectric down to 0.1 µm device generations. Incorporating nitrogen into the dielectric film blocks boron as well as increases the dielectric constant of the gate dielectric. The increase in the dielectric constant means a thicker dielectric can be used in comparison to pure $SiO_2$ hence reducing gate leakage. For the nitrogen (N) doping to be effective in circumventing the challenges described above in ultra-thin (e.g., 12 Å) gate dielectrics, it is essential to have high ($\geq 5\%$) total concentration of nitrogen in the dielectric film with the peak of the nitrogen concentration profile at the top surface of the gate dielectric.

Traditionally, thermal processes have been carried out in furnaces that process multiple wafers (5-100) at once. The furnaces have large volumes and it is difficult to pump out this huge volume. This coupled with the fact that the growth rate of most of the thermal processes goes down with decrease in process pressure has resulted in thermal processes usually being carried out at atmospheric (760 Torr) or slightly below atmospheric (>500 Torr) pressure.

Thermally grown silicon oxynitride has been used as gate dielectrics for several years from the 0.2 µm to 0.13 µm device generations. As the device technology has advanced from 0.2 µm to 0.1 µm the gate oxide has thinned from >25 Å to <12 Å. Hence, in order to block boron and reduce gate leakage the amount of nitrogen in the film has to be increased from <3% to 5-10%. When nitric oxide (NO) and nitrous dioxide ($N_2O$) are used to grow the oxynitride gate dielectric the N gets incorporated in the dielectric film simultaneously as the oxynitride grows, hence nitrogen is distributed evenly in the film. If NO or $N_2O$ are used to form silicon oxynitride by annealing an existing $SiO_2$ layer at elevated temperatures, the nitrogen incorporated by growing SiON at the Si-substrate/Oxide interface. Hence, nitrogen is incorporated at this interface. The amount of nitrogen in the later case (<2%) is less than in the former case (4-5%).

Silicon oxynitride grown directly with $N_2O$ or formed by annealing an $SiO_2$ film with $N_2O$ has been the favored candidate for higher technology generations (0.2 µm) devices. The <2% nitrogen in the film was sufficient to enhance the device performance with >25 Å thick gate dielectric. As the device technology advanced to 0.13 µm, the nitrogen in the film had to be increased from <2% to 4-5% by using NO direct growth or NO anneal, in order to reduce the leakage current in comparison to the undoped $SiO_2$ and prevent boron from diffusing through the thinner dielectric into the substrate. The amount of nitrogen incorporated by either one of these techniques is insufficient and the nitrogen concentration profile is inappropriate for extending SiON to 0.1 µM device generation as explained earlier. Lowering the process pressure would only reduce the rate of nitrogen incorporation into the film, hence the nitridation processes continued to be carried out at elevated pressures.

More recently, plasma nitridation has been used to nitride (to incorporate nitrogen into) the gate oxide. This technique results in high nitrogen concentration at the poly gate/oxide interface, which prevents boron penetration into the oxide dielectric. At the same time, the bulk of the oxide dielectric gets lightly doped with unassociated nitrogen during the plasma nitridation process, which reduces the electrical oxide thickness (EOT) over the starting oxide. The plasma nitridation process requires plasma hardware that can among other things cause metal contamination and plasma damage to the device and is difficult to maintain as compared to the traditional thermal processing hardware optimized for the front end processing. The challenges that plasma nitridation currently faces is scaling of device parameters Electrical Oxide Thickness (EOT) to <11 Å, Mobility degradation and lowering of Drive Current (Idsat) with ultra-thin dielectric (starting oxide <10 Å) for high performance application.

Another more recently adopted option has been thermal ammonia ($NH_3$) anneal which has been demonstrated to incorporate nitrogen in the excess of 5% and under certain process conditions can result in higher nitrogen content at the surface of the dielectric than at the interface. This chemistry however has not been as popular as the NO or $N_2O$ chemistries for several reasons. The $NH_3$ chemistry was production worthy when using furnaces for the thermal nitridation, as $O_2$ or moisture ($H_2O$) contamination even at the ppm level can prevent the incorporation of nitrogen in the film or give inconsistent results. In the case of furnace processing during the loading of wafers, large volumes of air and moisture enters the furnace which takes considerable amount of time to be removed resulting in inconsistent incorporation of nitrogen in the film in the wafers from the edge of the furnace to the center of the furnace. Unlike the NO and $N_2O$ chemistries, $NH_3$ anneal results in hydrogen incorporation in the dielectric which results in hot electrons and results in device reliability issues. It has been shown that the hydrogen in the silicon oxynitride film can be eliminated by a post nitridation anneal at elevated temperatures for short times in either inert ($N_2$ or Ar) or $O_2$ ambient.

With the advent of Rapid Thermal Processing (RTP) and its integration with other process chambers in a cluster type tool, the $NH_3$ process has become production worthy since the film can be efficiently nitrided in a controlled ambient without an $O_2$ or $H_2O$ contamination as well as hydrogen in the film can be eliminated by RTP anneal. However the problems of the interfacial peak still remain. In the existing art, a base oxide $SiO_2$ film (grown in a single wafer RTP chamber or a furnace) is subjected to ambients containing either pure $NH_3$ or mixture of $NH_3$ and inert gas ($N_2$ or Ar) at elevated temperatures (>850° C.) and atmospheric (760 Torr) or sub atmospheric (>500 Torr) pressures. It has been observed, however, that this results in a bimodal distribution of nitrogen within the starting $SiO_2$ film, with one nitrogen peak at the silicon oxynitride surface (or sometimes at the polysilicon cap/silicon oxynitride interface and a second peak at the silicon oxynitride/substrate interface. Such bimodal distribution has been observed even at reaction pressures as low as 100 Torr. The first peak is responsible for imparting good electrical properties to the device such as boron blocking and increasing the dielectric constant, thereby decreasing the leakage current in the device as compared to the starting oxide of similar electrical thickness. The second peak on the other hand imparts poor interfacial properties to the gate stack resulting in larger threshold voltage shifts and mobility degradation of charge carriers in the transistor.

The kinetics of thermal nitridation of gate oxide with $NH_3$ has been studied for 80-100 Å gate oxides. For the silicon oxynitride dielectric film to be useful in the 0.1 μm device technology node and beyond the thickness has to be <25 Å in the low leakage transistor devices and <12 Å for high performance transistors. The high pressure $NH_3$ process currently used for the silicon oxynitride formation will cause a high concentration of nitrogen at the silicon oxynitride/substrate interface resulting in poor device performance, limiting the scaling of this process at 0.1 μm technology and beyond.

SUMMARY

The current method of incorporating nitrogen into a dielectric film such as $SiO_2$ is not effective for forming an ultra-thin silicon oxynitride (SiON or $SiO_xN_y$) film with $NH_3$ and integrating into a gate stack to scale for use in the advanced technology nodes of 0.1 μm device and beyond for both high performance and low leakage applications. As will be apparent from the below, embodiments of the present invention fulfills this long-standing need and desire in the art.

According to an aspect of the invention, a method of forming a dielectric film includes incorporating nitrogen into a dielectric film using a nitridation gas and a rapid thermal annealing process. An ultra-low pressure of equal to or less than about 10 Torr is used for the rapid thermal annealing process.

According to another aspect of the invention, a method of forming a gate stack includes forming a silicon dioxide film on a substrate. Nitrogen is then incorporated into a silicon dioxide film using a rapid thermal annealing process and a nitridation gas, wherein the rapid thermal annealing process occurs at about or less than about 10 Torr. After the nitrogen is incorporated, the silicon dioxide film becomes a silicon oxynitride film. The rapid thermal annealing process is continued with the nitridation gas for a sufficient amount of time for nitrogen to be incorporated into the silicon dioxide film to form the silicon oxynitride with a nitrogen concentration of about or more than 5%. A cap layer is formed on the silicon oxynitride.

According to another aspect of the invention, a method of forming a gate stack includes incorporating nitrogen into a silicon dioxide film using a nitridation gas and a rapid thermal annealing process. An ultra-low pressure of equal to or less than about 10 Torr is used for the rapid thermal annealing process. The incorporating of nitrogen into the dielectric film forms a silicon oxynitride film. The silicon oxynitride film is post-annealed after a sufficient amount of nitrogen is incorporated into the silicon dioxide film for form the silicon oxynitride.

BRIEF DESCRIPTION OF THE DRAWINGS

Embodiments of the present invention is illustrated by way of examples and not limitations in the figures of the accompanying drawings, in which like references indicate similar elements and in which.

Table 1 compares various ways of incorporating nitrogen into a silicon dioxide film.

DETAILED DESCRIPTION

Embodiments of the present invention includes a novel method of forming a dielectric film that includes nitrogen, such as SiON or SiO$_x$N$_y$, using a rapid thermal annealing process with ammonia and an ultra-low processing pressure (e.g., about equal to or less than 10 Torr). In the following description, for purposes of explanation, numerous specific details are set forth in order to provide a thorough understanding of the present invention. It will be evident, however, to one skilled in the art that the present invention may be practiced without these specific details. In other instances, specific apparatus structures and methods have not been described so as not to obscure the present invention. The following description and drawings are illustrative of the invention and are not to be construed as limiting the invention.

In one embodiment, there is provided a method of forming a silicon oxynitride dielectric film using a rapid thermal annealing process with the presence of NH$_3$ referred to herein as RTA-NH$_3$. The processing pressure for forming the silicon oxynitride film is an ultra-low pressure (about equal to or less than 10 Torr). In addition, varying the processing pressure allows for the tailoring of the amount and distribution of nitrogen in the silicon oxynitride film.

In another embodiment, there is provided a method of integrating the silicon oxynitride film, (SiON film or SiO$_x$N$_y$ film) formed using the RTA-NH$_3$ process into a gate stack for forming a transistor.

In one embodiment, a substrate having a silicon dioxide (SiO$_2$) film formed there on is subjected to ammonia gas in a single wafer rapid thermal processing (RTP) chamber configured to carry out the rapid thermal annealing (RTA) process. The substrate can be a monocrystalline silicon wafer or a silicon wafer typically used in the art for making semiconductor devices. The SiO$_2$ film may have a thickness about less than 30 Å in one embodiment. In one embodiment, the ammonia gas flow into the RTP chamber ranges from about 100 sccm to 5 slm. It is to be appreciated that the gas flow may vary depending on the size of the processing chamber. For instance, the gas flows mentioned above are for a 200 mm single wafer reactor chamber. The gas flows may be proportionately increased for a 300 mm single wafer reactor chamber owing to the increase in the reactor volume. In one embodiment, the processing temperature ranges from 900-1100° C. and the processing pressure is about equal to or less than 10 Torr, or alternatively, may ranges from 0.010 Torr to about 10 Torr. The process uses either pure ammonia or ammonia diluted with an inert gas such as Argon or Nitrogen. An SiON or SiO$_x$N$_y$ is formed as a result.

In one embodiment, a commercially available reduced pressure RTP chamber hardware such as XE, XE Plus or Radiance made by Applied Materials, Inc. is used to carry out the RTA-NH$_3$ process to form the SiON or SiO$_x$N$_y$ film. Such reduced pressure RTP chamber provides an ultra-low processing pressure (e.g., 1 Torr or less than 10 Torr) for the forming of the SiON or SiO$_x$N$_y$ using RTA-NH$_3$. In one embodiment, a turbo pump can be connected or added to the RTP chamber to assist in lowering the total pressure of the RTP chamber to about 0.010 Torr (or 10 mTorr).

Figure 2:
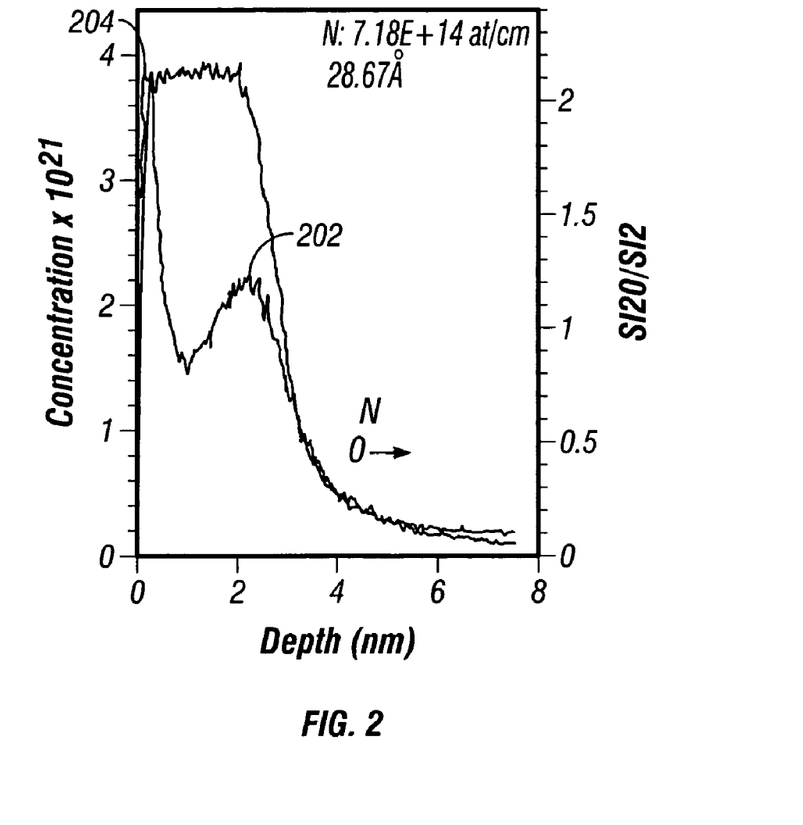
FIG. 2 illustrates a nitrogen concentration profile when a silicon oxynitride film is formed by a rapid thermal annealing (RTA) process in the presence of ammonia ($NH_3$) and high pressure (e.g., about 100 Torr and above)

It is observed that when the SiON or SiO$_x$N$_y$ film is formed by RTA in the presence of ammonia and at high pressure (e.g., 100 Torr), the nitrogen concentration profile in the SiON or SiO$_x$N$_y$ film as determined by a method called Time-of-Flight Secondary Ion Mass Spectrometry (TOF-SIMS) indicates that the nitrogen concentration profile has two peaks 202 and 204 as shown in FIG. 2. The first peak 204 indicates that the nitrogen concentration is high (about 4×10$^{21}$ units) at the oxide surface and the second peak 202 indicates that there is also a significant amount of nitrogen concentration (about 4×10$^{21}$ units) at the substrate interface.

Figure 3A:
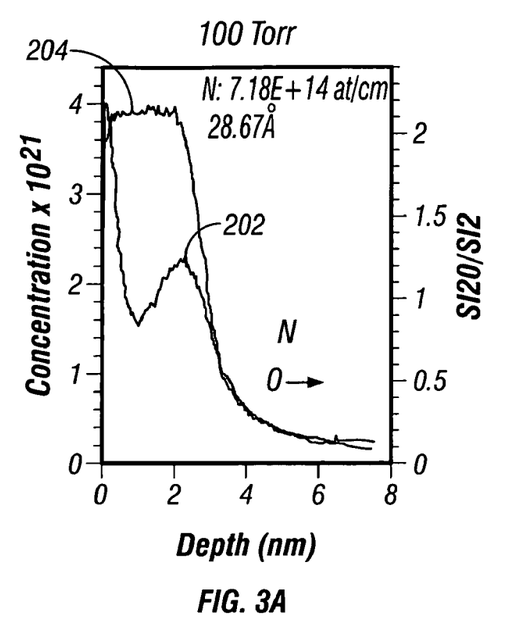
FIGS. 3A-3E illustrate the effect of reducing pressure on a nitrogen concentration profile when a silicon oxynitride film is formed by a rapid thermal annealing (RTA) process in the presence of ammonia ($NH_3$)
Figure 3B:
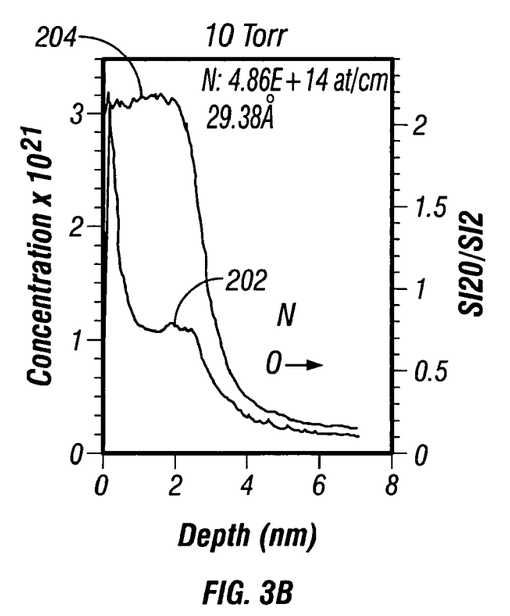
Figure 3C:
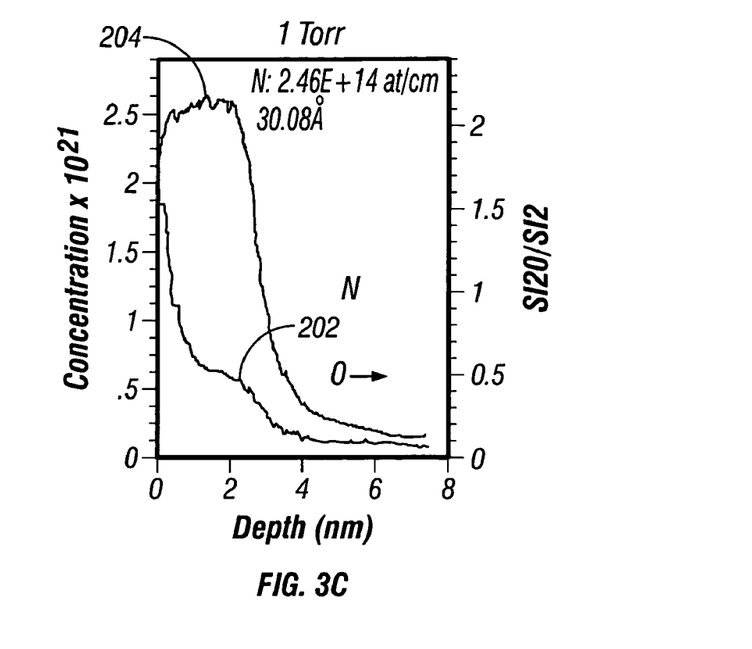
Figure 3D:
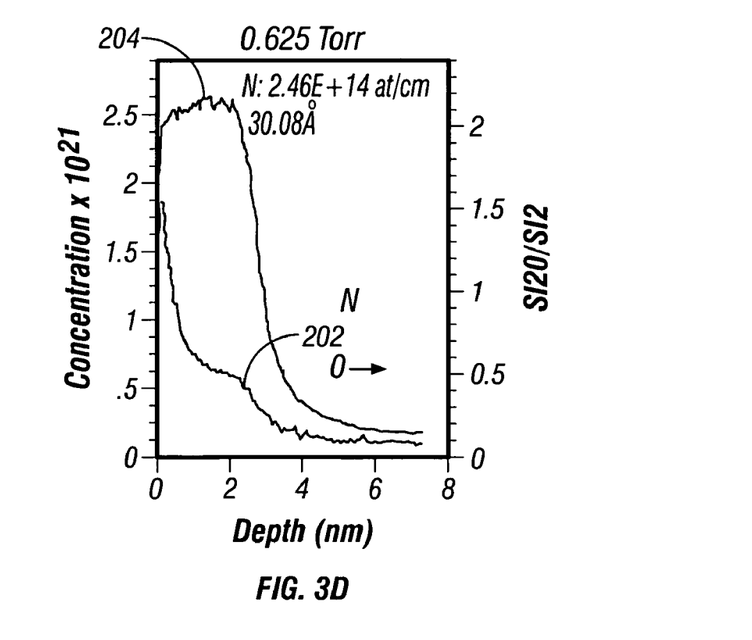
Figure 3E:
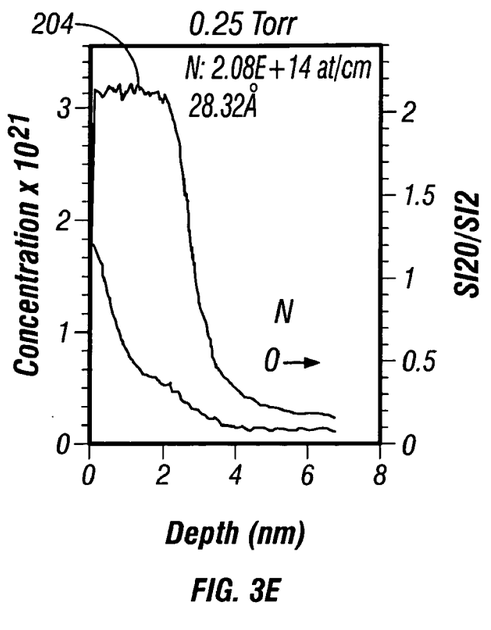

It is discovered by the inventors that changing the process condition such as processing pressure, temperature, and time can change the ratio of the intensities of these two peaks 204 and 202. As shown in FIGS. 3A-3E, the process pressure has a high impact on the ratio of the peak 202 and 204 intensities. As shown in FIGS. 3A-3E, when the pressure is reduced from 100 Torr to 0.250 Torr at a fixed temperature of 1000° C., the second peak 202 at the substrate interface disappears completely. As can be seen from FIG. 3A, when the SiON or SiO$_x$N$_y$ film is formed using RTA-NH$_3$ with a pressure at about 100 Torr, two peaks 202 and 204 are present. In FIG. 3B, when the SiON or SiO$_x$N$_y$ film is formed using RTA-NH$_3$ with a pressure at about 10 Torr, the peak 202 is decreasing indicating that the nitrogen concentration at the substrate interface is decreasing. Similarly, as shown in FIGS. 3C-3E, the peak 202 is decreasing until it is substantially eliminated at a process pressure of about 0.25 Torr.

Figure 4A:
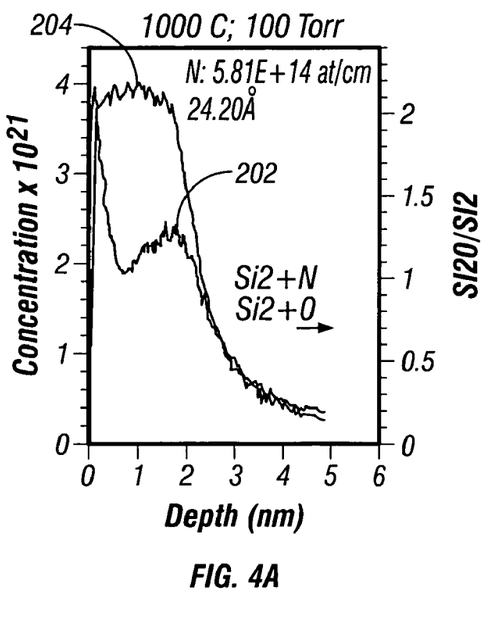
FIGS. 4A-4C illustrate the effect of processing temperature on a nitrogen concentration profile when a silicon oxynitride film is formed by a rapid thermal annealing (RTA) process in the presence of ammonia ($NH_3$) and ultra-low pressure (e.g., about less than or equal to 10 Torr)
Figure 4B:
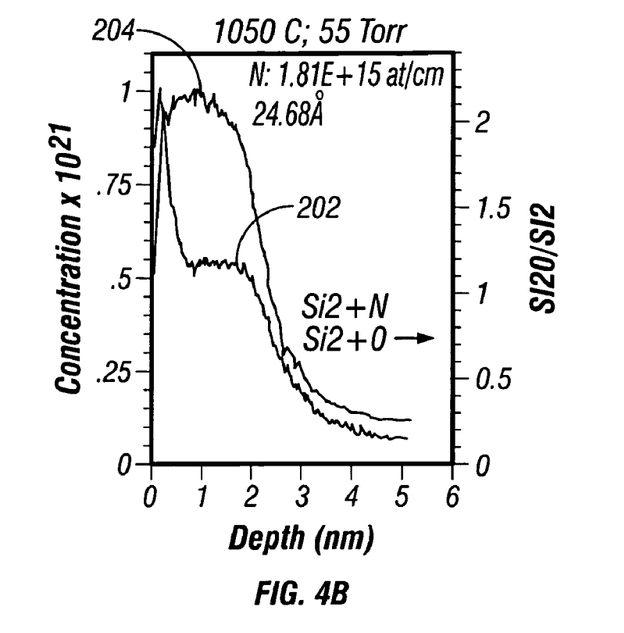
Figure 4C:
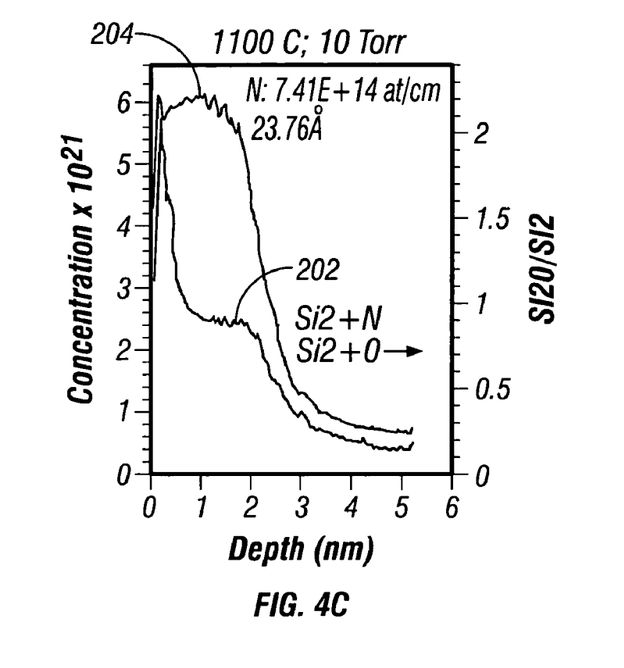

Additionally, increasing temperature while forming the SiON or SiO$_x$N$_y$ film at an ultra-low pressure (e.g., about equal to or less than 10 Torr) enhances the nitrogen concentration peak 204 at the surface as shown in FIGS. 4A-4C. For instance, in FIG. 3B, when the nitridation used to form the SiON or SiO$_x$N$_y$ film is done using the RTA-NH3 at about 10 Torr and about 1000° C., the peak 204 is at about 3.2×10$^{21}$ concentration units. In FIG. 4C, when the nitridation used to form the SiON or SiO$_x$N$_y$ film is done using the RTA-NH3 at about 10 Torr and about 1100° C. (100° C. higher) the peak 204 is at about 6×10$^{21}$ concentration units.

Thus, it is optimal to form the SiON or SiO$_x$N$_y$ film at an ultra-low pressure (about $\leq$10 Torr) and high temperature ($\geq$1000-1100° C.). Having a high nitrogen concentration at the first peak 204 (at the surface of the SiON or SiO$_x$N$_y$ film) and a low or substantially minimal nitrogen concentration at the substrate interface provides an ideal profile for an ultra-thin gate dielectric for advanced $\leq$0.1 μm technology nodes.

At low pressure, the nitrogen concentration dose in the SiON or SiO$_x$N$_y$ film can also be adjusted by changing the temperature or alternatively, by changing the process time while keeping the processing temperature fixed. For example, a similar quality SiON or SiO$_x$N$_y$ film is formed by nitridating a 6 Å silicon dioxide using the RTA-NH$_3$ process either at about 1000° C., 10 Torr, for 10 second or at about 1000° C., 1 Torr, for 45 second. Thus, lowering the pressure at a constant temperature requires increasing the time to achieve the same nitrogen dose in a film of equivalent thickness.

Figure 5A:
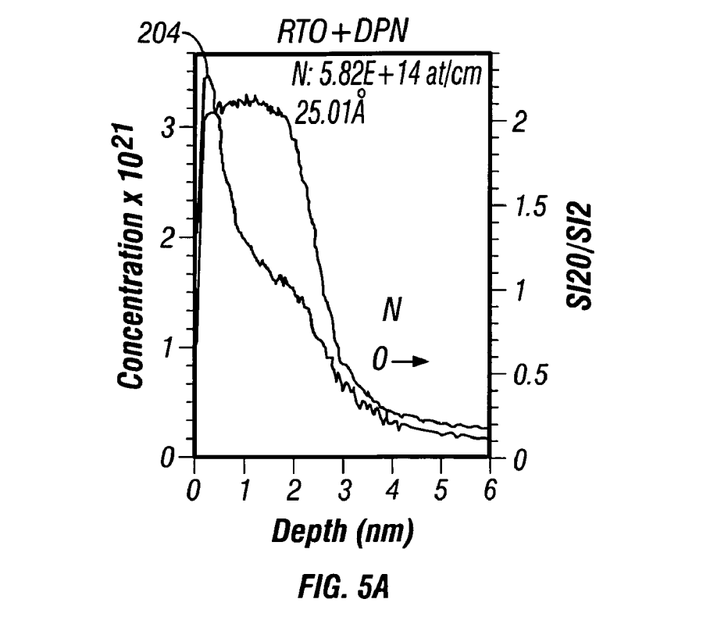
FIGS. 5A-5C compares the nitrogen concentration profile of a silicon oxynitride film formed by using plasma nitridation and by using RTA with NH$_3$.
Figure 5B:
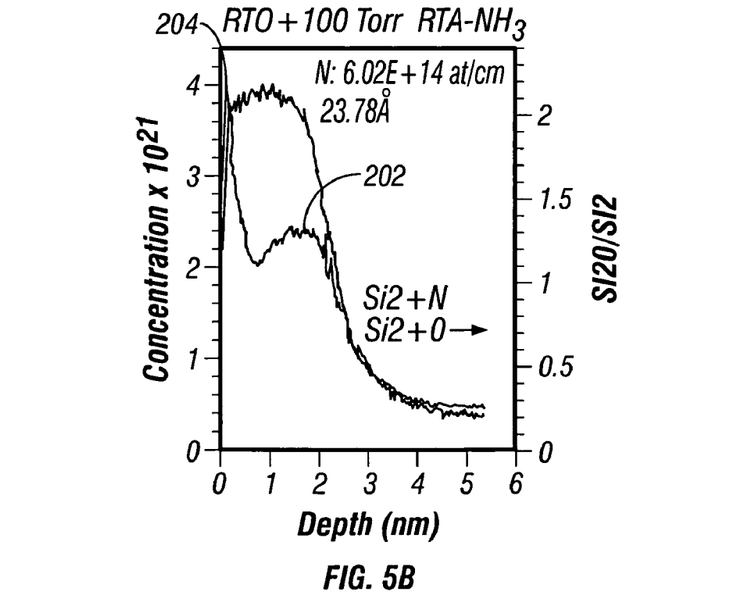
Figure 5C:
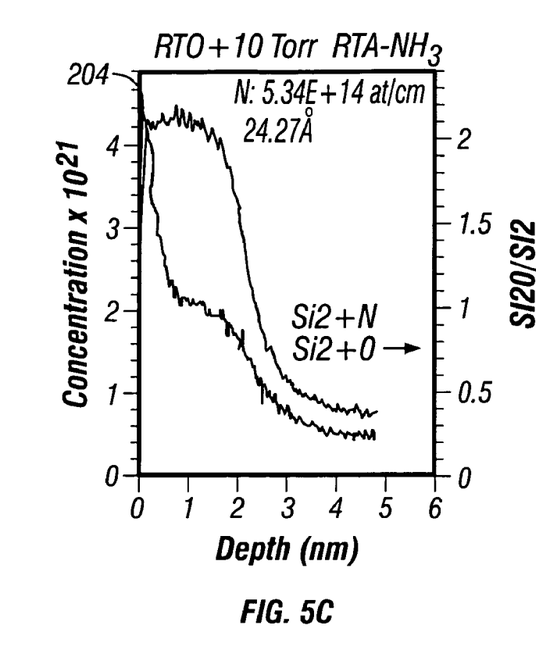

FIG. 5A-5C compare the nitrogen concentration profiles for SiON or SiO$_x$N$_y$ films manufactured using a plasma nitridation process with RTA-NH$_3$ process. In one embodiment, the plasma nitridation process used is Decoupled Plasma Nitridation (DPN) which is known in the art. DPN is a technology using inductive coupling to generate nitrogen plasma and incorporate a high level of nitrogen onto an oxide film. DPN allows formation of the silicon oxynitride film with less nitrogen at the oxide/substrate interface and higher nitrogen concentration at the oxide surface. In DPN, a surface, e.g., an SiO$_2$ film, is bombarded with nitrogen ions which break the SiO$_2$ film and bond the nitrogen ions to the SiO$_2$ film forming an SiON or SiO$_x$N$_y$ film. The SiO$_2$ film is thus exposed to decoupled nitrogen plasma. In one embodiment, DPN is performed in a chamber with pressure ranging from about 5-20 mTorr or less than 10 Torr, in the presence of nitrogen gas with a flow rate ranging from about 100-200 sccm and plasma power of about 300 Watt. The DPN process parameters can be modified depending on the chamber size and volume thickness of the dielectric film as is known in the art. The PDN yields an SiON or $SiO_xN_y$ film that does not have a second peak 202 at the substrate interface. In addition, in both processes, the DPN and the RTA-$NH_3$ processes, the SiON or $SiO_xN_y$ film is characterized by having the greatest concentration of nitrogen ($N_y$) at the top surface of the dielectric film, with "y" decreasing with depth. However, the tail of the nitrogen concentration profile for the DPN process seems to be extended closer to the Si substrate than the RTA-$NH_3$ process carried out at an ultra low processing pressure as shown in FIG. 5B-5C. This will be reflected in the increased drive current of the device that incorporates the SiON or $SiO_xN_y$ film formed using the RTA-$NH_3$ process than that of the SiON or $SiO_xN_y$ film formed using the plasma nitridation process. In addition, the SiON or $SiO_xN_y$ film formed using the RTA-$NH_3$ process will also be free of unassociated nitrogen. Another advantage of the RTA-$NH_3$ process over the DPN process is that is uses the same RTP reactor that has been developed and optimized for the front end anneals and $SiO_2$ growth. The RTP chamber has been optimized for ultra low metal contamination and issues that would eliminate or minimize any impact to the device integrity and reliability.

In one embodiment, the gate stack containing the RTA-$NH_3$ processed SiON or $SiO_xN_y$ film is manufactured in a cluster tool, such as an integrated Gate Stack Centura made by Applied Materials, Inc., is used to form a gate that has the SiON or $SiO_xN_y$ film formed as previously described for improved device performance. An example of cluster tool is shown in FIG. 6.

Figure 6:
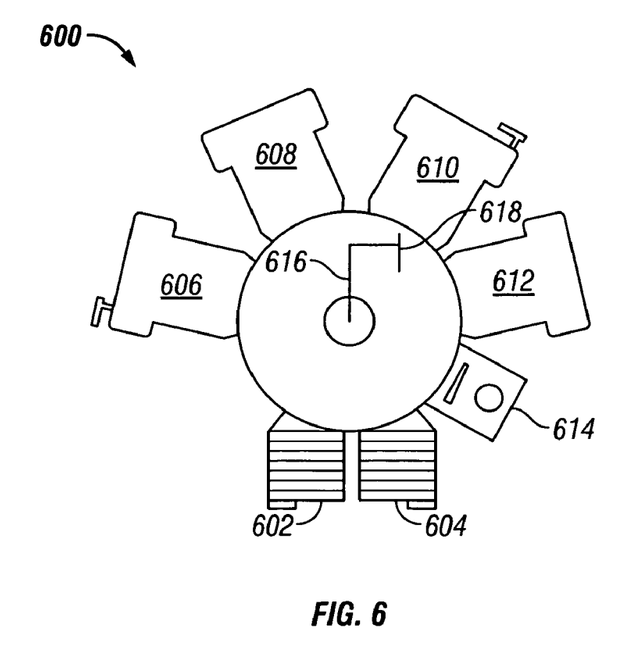
FIG. 6 illustrates cluster tool that can be used for some of the embodiments of the present invention.

FIG. 6 illustrates a cluster tool 600, which comprises several processing chambers, e.g., loadlock chambers 602 and 604, RTP chambers 606, 608, 610, a deposition chamber 612 (e.g., for depositing a polysilicon film), and a cool down chamber 614. The cluster tool 600 also includes a wafer-handling tool 616 used to transfer a substrate 618 (e.g., wafer) in and out of particular processing chamber. The wafer-handling tool 616 is typically located in a transfer chamber that can communicate to all of the processing chambers. The loadlock chambers 602 and 604 house substrates (e.g., wafers) to be processed. The deposition chamber 612 can be conventional chemical or physical vapor deposition that can be used to form a film or a layer as is known in the art. In one embodiment, the deposition chamber 612 is a deposition chamber that can be configured to form a polysilicon film or other electrode film. The chambers 606, 608, and 610 are chambers that can be configured to run a rapid thermal annealing (RTA) process at a reduced or ultra-low pressure (e.g., about equal to or less than 10 Torr). Any one of the chambers 606, 608, and 610 can be used to perform the RTA-$NH_3$ process previously described to form an SiON or an $SiO_xN_y$ film.

In one embodiment, an $SiO_2$ dielectric film with a physical thickness of about 4-15 Å is grown using a reduced pressure RTP chamber such as the RTP chamber 606 of the cluster tool 600 (FIG. 6). The $SiO_2$ dielectric film can be formed by a rapid thermal oxidation which is an oxidation process where the chamber uses lamp(s) to quickly heat and dry a substrate surface to form an oxidized layer in the presence of oxygen. The rapid thermal oxidation of a silicon substrate (or a wafer) can be carried out using a dry process rapid thermal oxidation with the presence of $O_2$, $O_2+N_2$, $O_2+Ar$, $N_2O$, or $N_2O+N_2$ gas mixtures. The gas or gas mixtures can have a total flow rate of about 1-5 slm. Alternatively, the rapid thermal oxidation of a silicon substrate can be carried out using a wet process such as In-Situ Steam Generation (ISSG) with the presence of $O_2+H_2$, $O_2+H_2+N_2$, or $N_2O+H_2$ having, for example, a total flow rate of about 1-5 slm with 1-13% $H_2$. In one embodiment, the rapid thermal oxidation process to form the $SiO_2$ dielectric film is formed at a processing temperature of about 800-1000° C. and a processing pressure of about 0.5-50 Torr for about 5-90 seconds which results in a $SiO_2$ dielectric film having a thickness in the range of 4-15 Å.

In one embodiment, after the $SiO_2$ dielectric film is formed in the RTP chamber 606, the substrate is transferred to another RTP chamber, e.g., the RTP chamber 608 of the cluster tool 600 under an inert (e.g., $N_2$ or Ar) environment with the transfer chamber pressure being less than or about 10 Torr to incorporate nitrogen into the $SiO_2$ dielectric film to form an SiON or $SiO_xN_y$ film. The RTP chamber 608 can be a reduced pressure chamber reactor such as an Applied Material reactor XE, XE Plus, or Radiance. The RTP chamber 608 is configured to have $NH_3$, $N_2$, or Ar gases plumbed to it to form an SiON or $SiO_xN_y$ as previous discussed. In one embodiment, the substrate with the $SiO_2$ dielectric film is heated to an elevated temperature of about 900-1100° C. with a flow of pure $NH_3$ or $NH_3$+Inert gas (e.g., $N_2$ or Ar) into the processing chamber, e.g., the RTP chamber 608. The pressure in the chamber is reduced to less than or about equal to 10 Torr. The SiON or $SiO_xN_y$ formed under this condition can have a profile similar to those shown in FIGS. 3C-3D. The SiON or $SiO_xN_y$ has a nitrogen concentration equal to or great than 5%. The peak concentration of the nitrogen within the $SiO_2$ film occurs at the top surface of the $SiO_2$ film.

In one embodiment, the SiON or $SiO_xN_y$ film is subjected to a post nitridation annealing (PNA) process in another RTP chamber such as the RTP chamber 610 of the cluster tool 600 (FIG. 6). The PNA process chemistry can either be pure $N_2$ or $O_2+N_2$ gas mixtures. In the event of a pure $N_2$ chemistry, the PNA can be carried out in the same RTP chamber, (e.g., the RTP chamber 600) as the RTA-$NH_3$ process that is used to form the SiON or $SiO_xN_y$ film. In one embodiment, the PNA includes heating up the substrate having the SiON or the $SiO_xN_y$ film to an elevated temperature of 1000-1100° C. at less than or equal to about 5 Torr total pressure. In one embodiment, pure $N_2$ gas of about 1 slm is flown into the RTP chamber (e.g., the RTP chamber 608 or 610) for about 60 seconds. Follow the $N_2$ flow, $O_2$ or $O_2+N_2$ gas mixture at about 1 slm total flow rate is flown into the RTP chamber for about 15 seconds. It is to be appreciated the flow rates mentioned are examples only for a particular reactor or processing chamber size (e.g., a 200 mm reactor). The flow rates are proportionately adjusted (increased or decreased) for other size reactors owing to the difference in volume.

In one embodiment, following the PNA process, the nitrogen containing gate dielectric (the SiON or $SiO_xN_y$) film is capped with a conductive layer such as a polysilicon film. The polysilicon film can be formed in a deposition chamber such as the deposition chamber 612 of the cluster tool 600 (FIG. 6). This completes the formation of the gate stack. The substrate can then be transferred to a cool down chamber such as the cool down chamber 614 and then be transferred to a storage area such as the loadlock 614 for further processing, testing, or other processes as known in the art.

It is to be appreciated that the gate stack that includes the gate dielectric film and the polysilicon cap film can be formed in one processing chamber or several processing chambers besides the cluster tool 600 previously described. For instance, the $SiO_2$ dielectric film can be formed first in one chamber. Then, the same chamber is adjusted for the rapid thermal annealing at the ultra low pressure to perform the nitridation process to form the SiON or $SiO_xN_y$ film. Then the same chamber can be adjusted to perform the PNA for the SiON or the $SiO_xN_y$ film. And, the polysilicon film is formed over SiON or $SiO_xN_y$ film in the same chamber.

A transistor formed with the gate stack as described herein has optimized performance due to the continuous and uniform processing environment or ambient owing to the use of the cluster tool 600, in one embodiment. The processing of the gate stack is formed without a break between any of the processes. Thus, better scaling in terms of reduced Electrical Oxide Thickness, leakage, or Drive Current can be achieved as compared to processes with breaks in between various processes.

Table 1 summarizes the various processes of incorporating nitrogen into an $SiO_2$ film including conventional processes as well as process of the exemplary embodiments of the present invention. Table 1 illustrates that incorporating nitrogen into the $SiO_2$ film using exemplary embodiments of the present invention gives superior nitrogen concentration profile. In addition, as mentioned above, the exemplary embodiments of the present invention allow one to tailor the nitrogen concentration profile to achieve an optimum SiON or $SiO_xN_y$ film for a particular application.

As shown in Table 1, when the nitridation process is carried out using NO or $NO+O_2$ gas mixture using a mixture growth process to thermally grow the SiON or $SiO_xN_y$ film. The nitrogen concentration ([N]) profile is incorporated throughout the $SiO_2$ film with a high nitrogen concentration at the substrate interface. When the nitridation process is carried out using $N_2O$ anneal using a conventional process, the nitrogen is incorporated close to the Si substrate-$SiO_2$ interface. Further, the nitrogen concentration incorporated is insufficient to block boron into the dielectric film or reduce leakage in 0.1 μm devices. When the nitration process is carried out using NO anneal using a conventional process, the nitrogen is incorporated at the Si substrate-$SiO_2$ interface with the nitrogen concentration being slightly higher compared to the $N_2O$ anneal process. However, it has been observed that boron tends to be trapped inside the $SiO_2$ film resulting in poor interfacial properties and not significant reduction in current leakage.

When the nitridation process is carried out using an $NH_3$ annealing process at high pressure that is equal to or greater than 100 Torr as is currently practiced in the art, the nitrogen is incorporated into the $SiO_2$ film with a bimodal nitrogen concentration distribution. As previously discussed, the nitrogen concentration profile includes a nitrogen peak at the surface of the film and a nitrogen peak at the substrate-$SiO_2$ interface. The nitrogen concentration is higher in the $NH_3$ annealing process at high pressure than the NO annealing process. Nitrogen at the surface of the film tends to trap boron but nitrogen at the substrate $SiO_2$ interface causes poor interfacial properties resulting in larger threshold voltage shifts and mobility degradation of charge carriers in the transistor. When the nitridation process is carried out using plasma nitridation, as acceptable nitrogen concentration profile is produced. High nitrogen concentration occurs at the surface of the $SiO_2$ film. Nitrogen at the surface can block the boron. Plasma nitridation allows for ultra-thin dielectric film forming (<10 Å) but is shown to cause drive current to degrade at such ultra-thin film.

When the nitridation process is carried out using an RTA $NH_3$ process at ultra-low pressure (e.g., $\leq$10 Torr), of the exemplary embodiments of the present invention, the nitrogen concentration profile has high nitrogen concentration at the surface of the $SiO_2$ film and no bimodal distribution. Also, the RTA-$NH_3$ process at the ultra-low pressure allows for Electrical Oxide Thickness scaling to less than 11 Å.

Although it has been describe that ammonia ($NH_3$) is used in many of the exemplary embodiments, it is to be appreciated that any nitrodizing or nitridation gas can be used or substituted for ammonia. For example, NO or $N_2O$ can be used to form the SiON or $SiO_xN_y$ using a rapid thermal annealing process at an ultra-low pressure (e.g., equal to or less than about 10 Torr). The discussion of the features of the embodiments using the RTA-$NH_3$ at ultra-low pressure is thus similarly applicable for nitridation process using other suitable nitrodizing or nitridation agents (e.g., NO and $N_2O$) using RTA at ultra-low pressure.

While certain exemplary embodiments have been described and shown in the accompanying drawings, it is to be understood that such embodiments are merely illustrative and not restrictive of the current invention, and that this invention is not restricted to the specific construction and arrangements shown and described since modification may occur to those ordinary skilled in the art.

In one embodiment, the entire gate stack from the gate oxide formation to the N doping of the dielectric layer and gate electrode formation is manufactured within as single tool with multiple chambers (e.g., the cluster tool) without breaking vacuum. Advance technology nodes ($\leq$0.1 μm) will have a few monolayers of oxide film as gate dielectric. Processing the gate stack within a single tool with controlled ambient without vacuum break and human handling/interference will eliminate any compromise to the device integrity as a result of contamination or damage from exposure to the processing ambient and handling of the wafer multiple times.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

The invention claimed is:

1. A method of forming a nitrogen-containing dielectric film comprising:
   incorporating nitrogen into a dielectric film using ammonia ($NH_3$) gas in a rapid thermal annealing process, wherein an ultra-low pressure equal to or less than about 10 Torr is used for the rapid thermal annealing process at a temperature between about 900-1100° C., wherein the nitrogen incorporated into the dielectric film forms only one nitrogen concentration peak, and wherein the nitrogen concentration peak occurs at the top surface of the dielectric film.

2. The method of forming a nitrogen-containing dielectric film of claim 1 wherein the nitrogen incorporated into the dielectric film has a nitrogen concentration equal to or greater than 5%.

3. The method of forming a nitrogen-containing dielectric film of claim 1 wherein the dielectric film is equal to or less than about 12 angstroms.

4. The method of forming a nitrogen-containing dielectric film of claim 1 wherein the dielectric film is silicon dioxide ($SiO_2$).

5. The method of forming a nitrogen-containing dielectric film of claim 1 wherein after the nitrogen is incorporated, a silicon oxynitride is formed.

6. A method of forming a gate stack comprising:
   forming a silicon dioxide film on a substrate;

incorporating nitrogen into the silicon dioxide film using a rapid thermal annealing process with ammonia (NH$_3$) gas at an ultra-low pressure equal to or less than about 10 Torr and at a temperature between about 900-1100° C., the incorporating of nitrogen forming a silicon oxynitride film on the substrate;

continuing the rapid thermal annealing process with ammonia (NH$_3$) gas for a sufficient amount of time for nitrogen to be incorporated into the silicon dioxide film to form the silicon oxynitride film with a nitrogen concentration of about or more than 5%, wherein the nitrogen incorporated into the silicon dioxide film forms only one nitrogen concentration peak, and wherein the nitrogen concentration peak occurs at the top surface of the silicon dioxide film; and forming a cap layer on the silicon oxynitride.

7. The method of forming a gate stack of claim 6 further comprising:

subjecting the silicon oxynitride film to a post annealing process after the silicon oxynitride is formed, wherein the post annealing process occurs at a temperature between about 1000-1100° C.

8. The method of forming a gate stack of claim 7 wherein the post annealing process occurs at a pressure of less than or equal to about 5 Torr.

9. A method of forming a dielectric film comprising:

incorporating nitrogen into a silicon dioxide film using ammonia (NH$_3$) gas in a rapid thermal annealing process at a temperature between about 900-1100° C., wherein an ultra-low pressure equal to or less than about 10 Torr is used for the rapid thermal annealing process, the incorporating of nitrogen into the silicon dioxide film forming a silicon oxynitride film, wherein the nitrogen incorporated into the silicon dioxide film forms only one nitrogen concentration peak, and wherein the nitrogen concentration peak occurs at the top surface of the silicon dioxide film; and post-annealing the silicon oxynitride film after a sufficient amount of nitrogen is incorporated into the silicon dioxide film.

10. The method of forming a dielectric film of claim 9 wherein the nitrogen incorporated into the silicon dioxide film has a nitrogen concentration equal to or greater than 5%.

11. The method of forming a dielectric film of claim 9 wherein the silicon dioxide film is equal to or less than about 12 angstroms.

12. The method of forming a dielectric film of claim 9 further comprising forming the silicon dioxide film.

13. A method of forming a gate stack comprising:

placing a substrate into a first processing chamber of a cluster tool, the cluster tool having a plurality of processing chambers;

forming a silicon dioxide film on the silicon wafer in the first processing chamber;

without breaking vacuum, transferring the substrate from the first processing chamber into a second processing chamber, the second processing chamber capable of running a rapid thermal annealing process at a reduced pressure equal to or less than about 10 Torr;

introducing ammonia (NH$_3$) gas into the second processing chamber while maintaining the second processing chamber at a temperature between about 900-1100° C. and at an ultra-low pressure to form a silicon oxynitride film; and continuing the ammonia (NH$_3$) gas into the second processing chamber for a sufficient amount of time for nitrogen to be incorporated into the silicon dioxide film to a nitrogen concentration of about or more than 5%, wherein the nitrogen incorporated into the silicon dioxide film forms only one nitrogen concentration peak, and wherein the nitrogen concentration peak occurs at the top surface of the silicon dioxide film.

14. The method of forming a gate stack of claim 13 comprising:

subjecting the substrate to a post annealing process after the silicon oxynitride film is formed, wherein the post annealing process occurs at a temperature between about 1000-1100° C.

15. The method of forming a gate stack of claim 14 wherein the post annealing process occurs in a third processing chamber.

16. The method of forming a gate stack of claim 14 wherein the post annealing process occurs at a pressure of about 5 Torr.

17. A method of treating a dielectric film comprising:

exposing the dielectric film to ammonia (NH$_3$) gas at an ultra-low pressure equal to or less than about 10 Torr; and subjecting the dielectric film to a rapid thermal annealing process during the exposing of the dielectric film to the ammonia (NH$_3$) gas to incorporate nitrogen into the dielectric film to form a silicon oxynitride film, wherein the rapid thermal annealing process occurs at a temperature between about 900-1100° C., wherein the nitrogen incorporated into the dielectric film forms only one nitrogen concentration peak, and wherein the nitrogen concentration peak occurs at the top surface of the dielectric film.

18. The method of treating a dielectric film of claim 17 wherein the dielectric film is silicon dioxide (SiO$_2$).

19. The method of treating a dielectric film of claim 17 wherein after the nitrogen is incorporated, a silicon oxynitride film is formed.

20. The method of treating a dielectric film of claim 19 further comprising:

subjecting the silicon oxynitride film to a post annealing process after the silicon oxynitride film is formed, wherein the post annealing process occurs at a temperature between about 1000-1100° C.

21. The method of treating a dielectric film of claim 20 wherein the post annealing process occurs at a pressure of less than or equal to about 5 Torr.

22. The method of treating a dielectric film of claim 17 wherein the subjecting the dielectric film to the rapid thermal annealing process is continued until a concentration of nitrogen of at least about 5% is incorporated into the dielectric film.

23. The method of treating a dielectric film of claim 19 further comprising subjecting the silicon oxynitride film to a post-annealing process wherein the silicon oxynitride is post annealed in a non-nitridation atmosphere after a desired concentration of nitrogen is incorporated into the dielectric film.

* * * * *

UNITED STATES PATENT AND TRADEMARK OFFICE
CERTIFICATE OF CORRECTION

PATENT NO. : 7,658,973 B2
APPLICATION NO. : 10/772893
DATED : February 9, 2010
INVENTOR(S) : Narwankar et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1131 days.

Signed and Sealed this

Thirtieth Day of November, 2010

David J. Kappos
*Director of the United States Patent and Trademark Office*